US007875309B2

(12) United States Patent
Kamata et al.

(10) Patent No.: US 7,875,309 B2
(45) Date of Patent: Jan. 25, 2011

(54) METHOD FOR COATING ELECTRICAL CABLE

(75) Inventors: Takeshi Kamata, Shizuoka (JP); Keigo Sugimura, Shizuoka (JP); Shigeharu Suzuki, Shizuoka (JP); Kiyoshi Yagi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 107 days.

(21) Appl. No.: 11/147,168

(22) Filed: Jun. 8, 2005

(65) Prior Publication Data

US 2005/0227015 A1 Oct. 13, 2005

Related U.S. Application Data

(62) Division of application No. 10/635,644, filed on Aug. 7, 2003, now Pat. No. 6,918,962.

(30) Foreign Application Priority Data

Aug. 9, 2002 (JP) ............................ 2002-233728

(51) Int. Cl.
*B05D 5/12* (2006.01)
*B05D 1/02* (2006.01)
*C23C 16/52* (2006.01)

(52) U.S. Cl. .......................... 427/117; 427/8; 427/424; 427/427.2

(58) Field of Classification Search .................... 427/8, 427/117, 421.1, 424, 427.2
See application file for complete search history.

(56) References Cited

U.S. PATENT DOCUMENTS 2,186,555 A * 1/1940 Phillips ...................... 101/36
3,903,840 A 9/1975 Gemelli ...................... 118/712
4,387,665 A * 6/1983 Clinton ...................... 118/674
4,503,437 A 3/1985 Katzschner .................. 347/43
4,877,645 A * 10/1989 Bleich et al. ................ 427/117
5,142,298 A * 8/1992 Hoffmann et al. .............. 347/4
5,237,917 A * 8/1993 Traut et al. .................... 101/35
5,343,605 A * 9/1994 Nazerian et al. ........... 29/33 M (Continued)

FOREIGN PATENT DOCUMENTS

EP 0330103 8/1989

(Continued)

OTHER PUBLICATIONS

European Search Report dated Sep. 28, 2004.

*Primary Examiner*—Brian K Talbot
(74) *Attorney, Agent, or Firm*—Kratz, Quintos & Hanson, LLP

(57) ABSTRACT

An electrical cable coating method provides a coating layer on an outer surface of an electrical cable which is moving along a predetermined direction. The method involves utilizing a coating liquid jet unit to jet a given amount of a coating liquid at regular intervals to provide a coating layer on the outer surface of the electrical cable, utilizing a storage device to store a pattern for depositing the coating liquid on the outer surface of the electrical cable, utilizing a detection device to determine the moving speed of the electrical cable, and utilizing a control unit to control the coating liquid jet unit to jet a coating liquid to deposit the coating liquid on the outer surface to define the pattern based on the electrical cable moving speed.

4 Claims, 5 Drawing Sheets

U.S. PATENT DOCUMENTS

| | | | | | |
|---|---|---|---|---|---|
| 5,379,363 | A | * | 1/1995 | Bonicel et al. | 385/114 |
| 5,444,466 | A | | 8/1995 | Smyczek et al. | 347/4 |
| 5,645,899 | A | * | 7/1997 | Unterberger | 427/558 |
| 5,904,039 | A | * | 5/1999 | Bruckner et al. | 60/783 |
| 6,918,962 | B2 | * | 7/2005 | Kamata et al. | 118/682 |

FOREIGN PATENT DOCUMENTS

| | | | | |
|---|---|---|---|---|
| EP | 1324355 | A2 | | 7/2003 |
| JP | 10-031918 | | * | 2/1998 |
| JP | 10031918 | A | * | 2/1998 |

* cited by examiner

METHOD FOR COATING ELECTRICAL CABLE

CROSS REFERENCE TO RELATED APPLICATION

This application is a division of Ser. No. 10/635,644, filed Aug. 7, 2003, now U.S. Pat. No. 6,918,962 which is based on Japanese Application No. 2002-233728 filed Aug. 9, 2002.

BACKGROUND OF THE INVENTION

1. Field of the Invention

The present invention relates to an electrical cable coating method and an apparatus thereof for providing a coating layer on an outer surface of an electrical cable. The electrical cable has an electrically conductive core and an insulating covering layer to cover the core.

2. Related Art

An automotive vehicle is equipped with various kinds of electronic instruments. Therefore, the automotive vehicle is arranged with wiring harnesses for transmitting electrical powers from a power source and control signals from a computer to the electronic instruments. Each wiring harness has a plurality of electrical cables and connectors fitted to ends of the cables.

The electrical cable has an electrically conductive core and a covering layer made of an insulating synthetic resin for covering the core. Each connector has an electrically conductive terminal fitting and a dielectric connector housing. The terminal fitting is fitted to an end of the electrical cable to electrically connect to the core of the cable. The connector housing has a box shape to accommodate the terminal fitting.

To assemble the wiring harness, each electrical cable is cut to have an appropriate length and then a terminal fitting is fitted to an end of the cable. If desired, the cables are connected to each other. Thereafter, the terminal fitting is inserted into the connector housing to assemble the wiring harness.

Each electrical cable of the wiring harness shall be discerned in the core size, the material of the covering layer that is selected based on a heat resistance performance, and its application. The applications of the cables are systems of the vehicle such as an air bag, an anti-lock brake system (ABS) and a vehicle speed detecting system, which require electrical cables for transmitting control signals and for supplying electrical powers.

In order to discern the cables in their applications, the cables composing the wiring harness each have a stripe pattern consisting of two different colors on an outer surface of the cable. Conventionally, a colorant having a desired color is mixed with a synthetic resin material defining a covering layer of the cable, before the resin material is extruded around the core of the cable to cover the core. Then, another colorant having a color different from the desired color of the covering layer is deposited partially on an outer surface of the covering layer of the core. This provides a stripe pattern on the electrical cable.

However, a cable having such a stripe pattern has a disadvantage that the colorant deposited on the outer surface of the cable in the latter process may wear off from the outer surface with time. The wearing of the colorant is disadvantageous for discerning the stripe pattern. Thus, in a conventional improving method, the outer surface of the cable that has a stripe pattern is coated by, for example, a coating layer consisting of a transparent acrylic resin.

For example, the cable having a stripe color pattern is dipped in a coating liquid consisting of the coating material of the acrylic resin and an organic solvent for dissolving the coating material. Alternatively, the coating liquid is blasted with a high-pressure air as an aerosol on the outer surface of the cable. In addition, to improve productivity of the wring harness, the coating process to provide the coating layer on the outer surface of the cable is desirably carried out in a an assembling step of the wiring harness such as a step for cutting the wire into desired length ones.

In the step for cutting the electrical cable into the desired length ones, the electrical cable is cut after the electrical cable is fed as much as the desired length by a conveyor or the like. Thus, the moving speed of the electrical cable varies during the cutting step. The coating method, in which the electrical cable is dipped in the coating liquid, can not provide an uniform thickness of the coating layer defined on the outer surface of the cable, because the moving speed of the cable varies during the cutting step of the cable. That is, the coating layer defined on the outer surface of the cable doses not have an uniform thickness. This causes the disadvantage that the outer surface has a coating layer having a too much thickness, which is undesirable in the view of a resource saving.

Furthermore, when the coating liquid is blasted as an aerosol on an outer surface of an electrical cable, a 80 to 90% amount of the blasted coating liquid is not deposited on the outer surface of the electrical cable. This needs to blast a large amount of the coating liquid so that a coating layer having a predetermined thickness is defined on the outer surface. This is disadvantageous for saving resources thereof.

Therefore, an object of the present invention is to provide a method and an apparatus that can save resources thereof.

SUMMARY OF THE INVENTION

To achieve the above-mentioned object, an electrical cable coating method for providing a coating layer on an outer surface of an electrical cable which is moving along a predetermined direction is characterized in that the method includes:

jetting a given amount of a coating liquid at regular intervals on the outer surface of the electrical cable to provide a coating layer on the outer surface of the electrical cable, wherein the coating liquid includes a coating material for defining the coating layer and a solvent for dissolving the coating material.

Thus, a given amount of the coating liquid is jetted on the outer surface of the electrical cable at the regular intervals. The coating liquid can be adjusted in the jetting amount and jetting duration as corresponding to a desirable thickness of the coating layer. Therefore, the coating liquid can be efficiently deposited on the outer surface of the electrical cable. This can save resources related to the coating liquid.

Preferably, the method further includes:

jetting a given amount of a colorant at the regular intervals on the outer surface of the electrical cable to deposit the colorant on the outer surface before jetting a given amount of a coating liquid at the regular intervals toward the outer surface of the electrical cable to provide a coating layer on the colorant coated on the outer surface of the electrical cable.

Thus, a given amount of the coating liquid is jetted on the colorant deposited on the outer surface of the electrical cable. This prevents the colorant from wearing off with time. The coating liquid covering the colorant can be effectively coated on the outer surface of the electrical cable.

Another aspect of the invention is an electrical cable coating apparatus for providing a coating layer on an outer surface of an electrical cable which is moving along a predetermined direction. The apparatus comprises:

a coating liquid jet means for jetting a given amount of a coating liquid at regular intervals on the outer surface of the electrical cable to provide a coating layer on the outer surface of the electrical cable, wherein the coating liquid includes a coating material for defining the coating layer and a solvent for dissolving the coating material.

Thus, the coating liquid can be adjusted in the jetting amount and jetting duration as corresponding to a desirable thickness of the coating layer. Therefore, the coating liquid can be efficiently deposited on the outer surface of the electrical cable. This can save resources related to the coating liquid.

Preferably, the apparatus further includes:

a colorant jetting means disposed upstream from the coating liquid jet means in the cable moving direction for jetting a given amount of a colorant at the regular intervals on the outer surface of the electrical cable, a detection means for measuring the moving speed of the electrical cable, a storage device for storing a distance between the coating liquid jet means and the colorant jetting means, and a control means for controlling the coating liquid jet means to jet a given amount of a coating liquid on the colorant coated on the outer surface of the electrical cable to deposit the colorant on the outer surface based on the distance and the electrical cable moving speed measured by the detection means.

Thus, the control means instructs the coating liquid jet means to jet the coating liquid on the outer surface in consideration of the moving speed of the electrical cable. This surely defines the coating layer on the colorant on the outer surface 3*a* of the electrical cable. This prevents the colorant from wearing off with time.

Alternatively, the apparatus may includes:

a storage means for storing a pattern for depositing the coating liquid on the outer surface of the electrical cable, a detection means for measuring the moving speed of the electrical cable, and a control means for controlling the coating liquid jet means to jet a coating liquid on the outer surface of the electrical cable to deposit the coating liquid on the outer surface to define the pattern based on the electrical cable moving speed measured by the detection means. This surely defines the coating layer on the outer surface of the electrical cable in the predetermined pattern regardless of the moving speed of the electrical cable. This can save resources related to the coating liquid.

Preferably, the apparatus is combined with a cutting installation for cutting the electrical cable after the electrical cable is moved as much as a given distance in the predetermined direction. This decreases a space required for installing the coating apparatus and the electrical cable cutting unit and also decreases working hours for assembling the electrical cables.

The colorant referred in this specification is a liquid-like material including a coloring material (an industrial organic material) distributed in a solution such as water. The colorant is a dye or a pigment, which is generally organic and synthetic. A pigment is sometimes used as a dye, and vice versa. More specifically, the colorant referred in this specification is either of a coloring liquid and a coating material. The coloring liquid includes a dye dispersed in a solution liquid, and the coating material includes a pigment dispersed in a dispersion liquid. Thus, the dye infiltrates into a covering layer when the covering layer is coated with the colorant. In the meantime, the pigment deposits on an outer surface of a covering layer without infiltration into the covering layer when the covering layer is coated with the coating material. However, the process for depositing a colorant on an outer surface of a covering layer shows coloring a partial outer surface of a covering layer with a dye and also painting a partial outer surface of a covering layer with a pigment.

Preferably, the solvent and the dispersion liquid may be affinitive to a synthetic resin material defining a covering layer of the cable. This makes it sure that the dye infiltrates into the covering layer and that the pigment deposits on the outer surface of the covering layer.

Preferably, the coating material is at least one selected from poly methylmethacrylate (PMMA), a silicon resin, polyamide, a urethane resin, ethylene ethyl acrylate copolymer (EEA), polyvinyl alcohol (PVA), and ethylene-vinyl acetate copolymer (EVA). The solvent for dissolving the coating material is preferably selected from alcohol, poly alcohol, ketene, ester, hexane, and chloroform, which conforms to the coating material.

DETAILED DESCRIPTION OF PREFERRED EMBODIMENT

Figure 1:
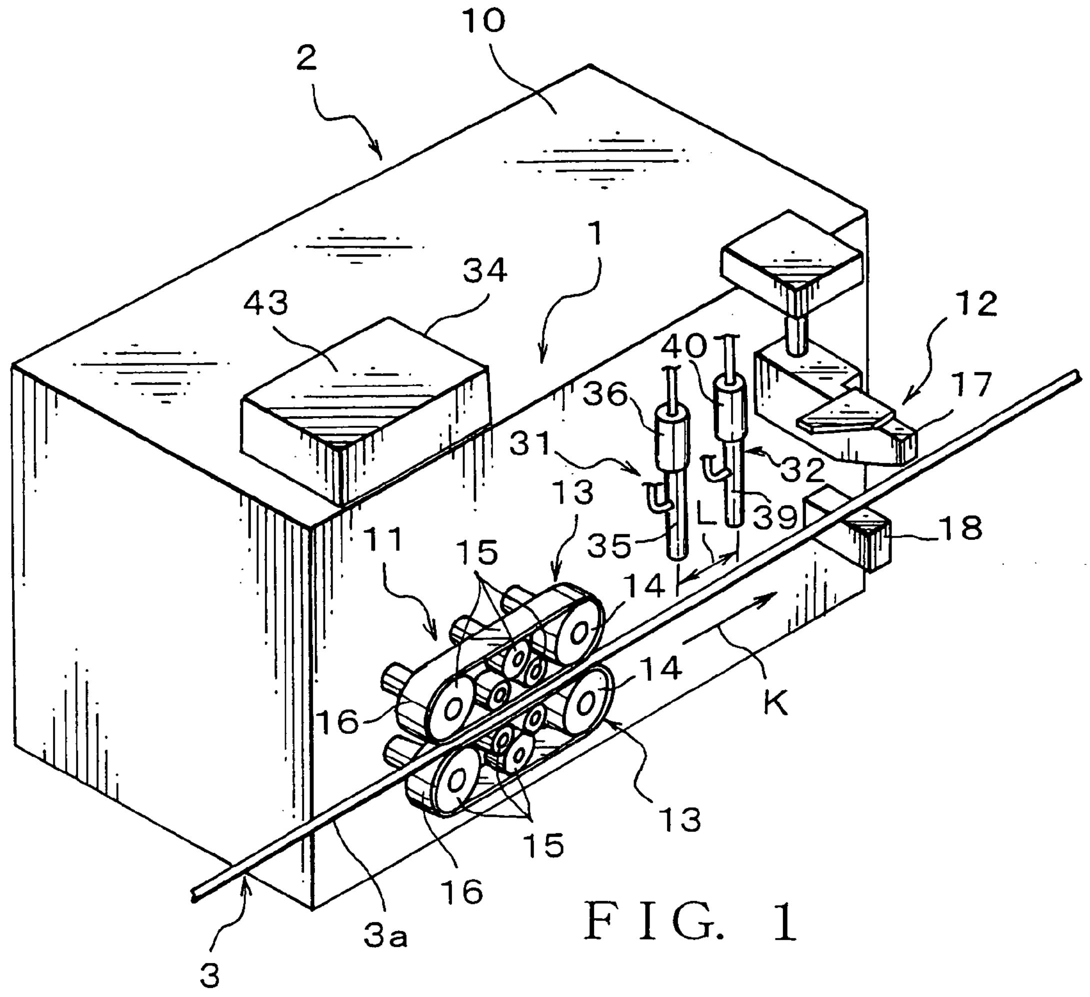
FIG. 1 is a perspective view showing an electrical cable cutting installation attached with a cable coating apparatus of a first embodiment of the present invention.

Referring to FIGS. 1 to 7, an electrical cable coating apparatus (called as a coating apparatus hereinafter) that is a first embodiment of the present invention will be discussed. As illustrated in FIG. 1, a coating apparatus 1 is mounted on an electrical cable cutting installation 2 and provides a coating layer 6 (shown in FIGS. 5 to 7) partially on an outer surface outer surface 3*a* of an electrical cable 3 that is cut into desired length ones by the electrical cable cutting installation 2.

The electrical cable cutting installation 2, as illustrated in FIG. 1, has a main body 10 disposed on a floor in a factory, a feed length measuring unit 11, and a cutting unit 12. The main body 10 is configured in a box shape. The feed length measuring unit 11 has a pair of feeding belt units 13. Each feeding belt unit 13 has a driving pulley 14, a plurality of follower pulleys 15, and an endless belt 16. The driving pulley 14 is driven to rotate by a drive unit such as a motor. Each follower pulley 15 is rotatably supported on the main body 10. The endless belt 16 is a ring belt that surrounds the driving pulley 14 and the follower pulleys 15 such that the endless belt 16 moves along the driving pulley 14 and the follower pulleys 15.

The pair of feeding belt units 13 are vertically disposed in parallel to each other. The pair of feeding belt units 13 pinch the electrical cable 3 therebetween, and the two driving pulleys 14 rotate at the same speed as each other but each in a direction opposed to each other. This rotates the endless belts 16 to feed the electrical cable 3 as much as given length. The feeding belt units 13 feed the electrical cable 3 in a longitudinal direction of the cable which is shown by an arrow K. The arrow K is along a horizontal direction.

The cutting unit 12 is positioned downstream from the pair of feeding belt units 13 in the arrow direction K. The cutting unit 12 has a pair of cutting blades 17 and 18 which align with each other vertically. The cutting blades 17 and 18 come close to and apart from each other. The pair of cutting blades 17 and 18 come close to each other to pinch the electrical cable 3 fed by the pair of feeding belt units 13 therebetween to cut the cable. The pair of cutting blades 17 and 18 come apart from each other to leave the electrical cable 3.

Thus configured cutting installation 2 pinches the electrical cable 3 between the pair of feeding belt units 13 to feed the cable along the arrow K while the pair of cutting blades 17 and 18 of the cutting unit 12 are still apart from each other. After the electrical cable 3 is fed as much as a given length, the driving pulleys 14 of the pair of feeding belt units 13 stop. Then, the pair of cutting blades 17 and 18 come close to each other to pinch and cut the electrical cable 3 therebetween. Thereafter, the cutting installation 2 feeds the electrical cable 3 along the arrow k again.

Figure 5:
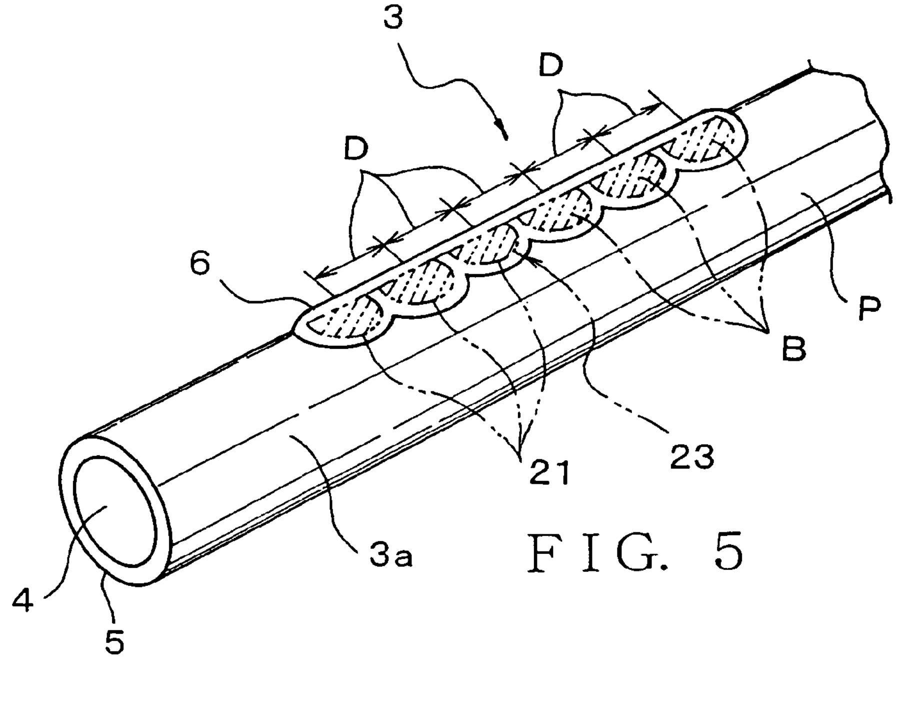
FIG. 5 is a perspective view showing an electrical cable that has a coating layer defined by the coating apparatus of FIG. 2.

The coating apparatus 1, as illustrated in FIG. 5, provides the coating layer 6 partially on the outer surface 3*a* of the electrical cable 3. A plurality of the electrical cables 3 compose a wiring harness arranged in an automotive vehicle. The electrical cable 3 has an electrically conductive core 4 and an insulating covering layer 5. The core 4 is defined by a plurality of electrically conductive stranded wires. The wire core 4 may be made of an electrically conductive metal. The core 4 may be defined by a single wire. The covering layer 5 is made of, for example, a synthetic resin material such as poly vinyl chloride (PVC). The covering layer 5 covers the core 4. The outer surface 3*a* of the electrical cable 3 is an outer surface of the covering layer 5.

The covering layer 5 has a single color P. A desirable colorant may be mixed with a synthetic resin defining the covering layer 5 to provide the single color P of the outer surface 3*a* of the electrical cable 3. The color P may be an original color of the synthetic resin without mixing the colorant into the resin of the covering layer 5. The outer surface 3*a* of the covering layer 5 of the electrical cable 3 is referred as a non-colored state cable, when no colorant is mixed into the synthetic resin. In the non-colored state cable, the outer surface 3*a* of the electrical cable 3 has its original color.

The coating layer 6 is made of a transparent synthetic resin. The synthetic resin of the coating layer 6 is preferably at least one selected from poly methylmethacrylate (PMMA), a silicon resin, polyamide a urethane resin, ethylene ethyl acrylate copolymer (EEA), polyvinyl alcohol (PVA), and ethylene-vinyl acetate copolymer (EVA).

The coating layer 6 provided partially on the outer surface 3*a* of the electrical cable 3 has a mark 23 that includes a plurality of dots 21. Each dot 21 has a color B (shown by parallel chain lines in FIGS. 5 and 6). The color B is different from the color P. The dot 21 is defined when a dye infiltrates into the outer surface 3*a* of the electrical cable 3 or when a pigment deposits on the outer surface 3*a* of the electrical cable 3.

Figure 6:
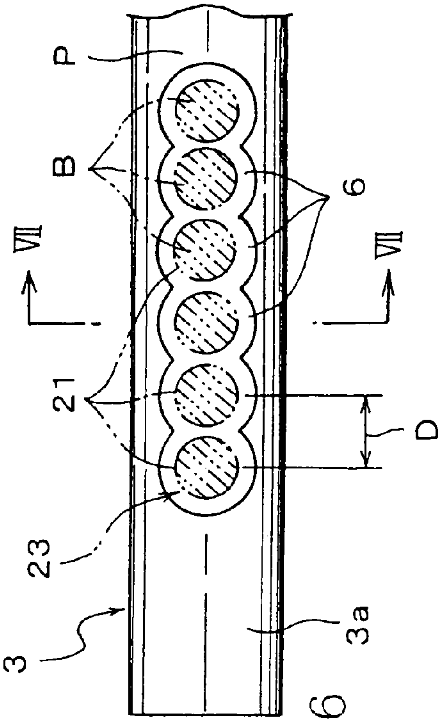
FIG. 6 is a plan view showing the electrical cable of FIG. 5.

The dot 21 is circular in a plan view as illustrated in FIG. 6. The plurality of dots 21 are aligned with each other in a longitudinal direction to define a predetermined pattern. In the illustrated example, there are six of the dots 21 along the longitudinal direction of the electrical cable 3. The distance D between the centers of adjacent two of the dots 21 is predetermined as well as the size of each dot 21.

Figure 7:
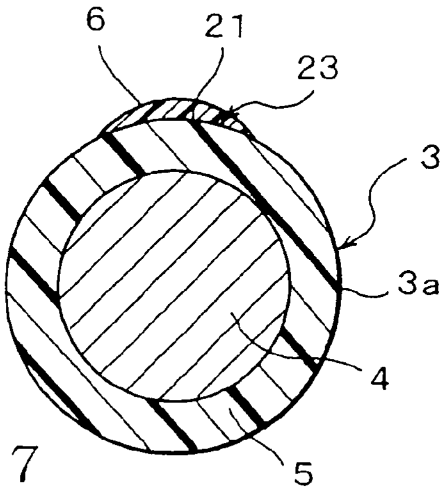
FIG. 7 is a sectional view taken along line VII-VII of FIG. 6.

As illustrated in FIG. 7, the coating layer 6 covers the dots 21 of the mark 23. The coating layer 6 prevents a dye or a pigment configuring the dots 21 from wearing off from the outer surface 3*a*.

A plurality of the electrical cables 3 are bundled, and connectors are fitted to ends of the electrical cables 3, completing the aforementioned wiring harness. The connectors are coupled to connectors of various kinds of electronic instruments of an automobile vehicle so that the electrical cables 3 of the wiring harness transmit various types of signals and powers to the electronic instruments.

Figure 2:
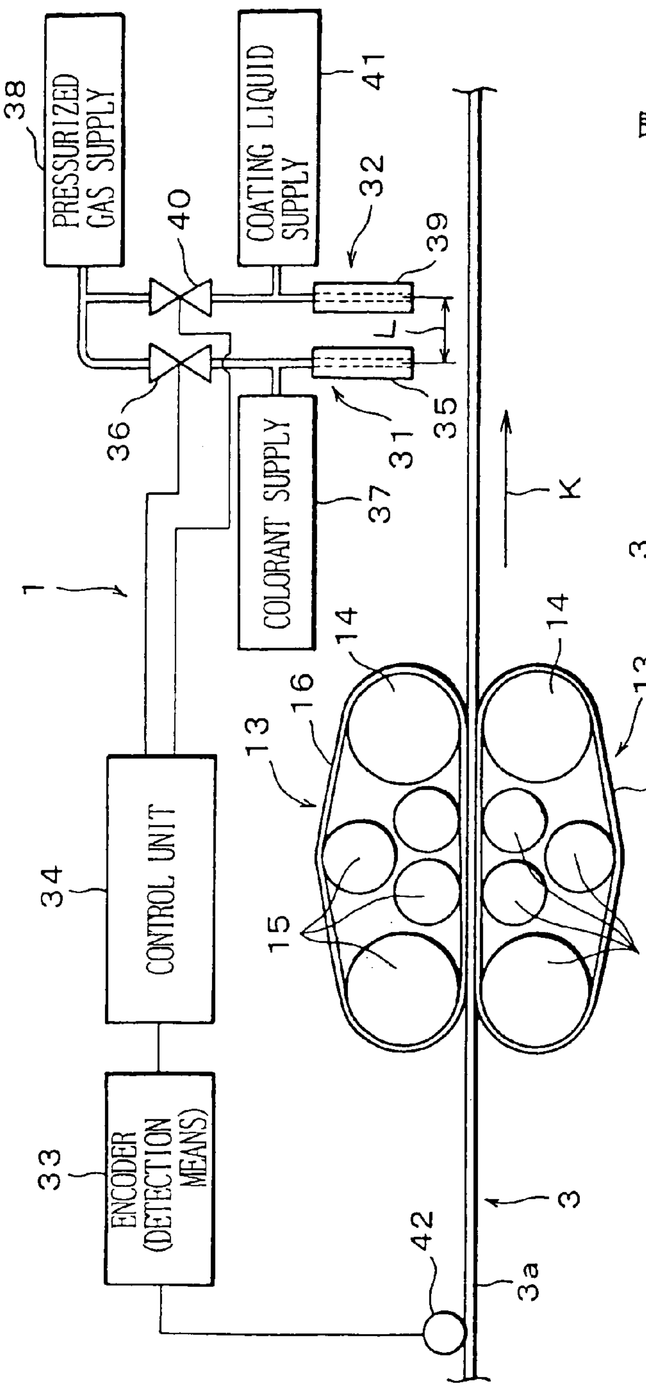
FIG. 2 is an explanatory view showing a configuration of the coating apparatus of FIG. 1.

The coating apparatus 1 provides thus configured mark 23 on the outer surface 3*a* of the electrical cable 3 and then defines the coating layer 6 to cover the mark 23. As illustrated in FIG. 2, the coating apparatus 1 has a coloring jet unit 31 that is a colorant jet means, a jet unit 32 that is a coating liquid jet means, an encoder 33 that is a detection means, and a control unit 34. The coloring jet unit 31 and the coating liquid jet unit 32 are disposed along the arrow K.

As illustrated in FIG. 1, the coloring jet unit 31 is disposed between the pair of feeding belt units 13 of the feed length measuring unit 11 and the pair of cutting blades 17, 18 of the cutting unit 12. As illustrated in FIG. 2, the coloring jet unit coloring jet unit 31 has a nozzle 35 and a valve 36. The nozzle 35 is opposed to the electrical cable 3 that is moved along the arrow K by the pair of feeding belt units 13. The nozzle 35 receives a colorant T (FIG. 4) from a colorant supply 37 (FIG. 2). The colorant T has the color B.

The valve 36 communicates with the nozzle 35, and the valve 36 communicates with a pressurized gas supply 38 (FIG. 2). The pressurized gas supply 38 supplies a pressurized gas to a nozzle 39 through a valve 40 discussed later. The opening of the valve 36 jets the colorant T toward the outer surface 3*a* of the electrical cable 3 through the nozzle 35 by means of the pressurized gas supplied from the pressurized gas supply 38.

Figure 4:
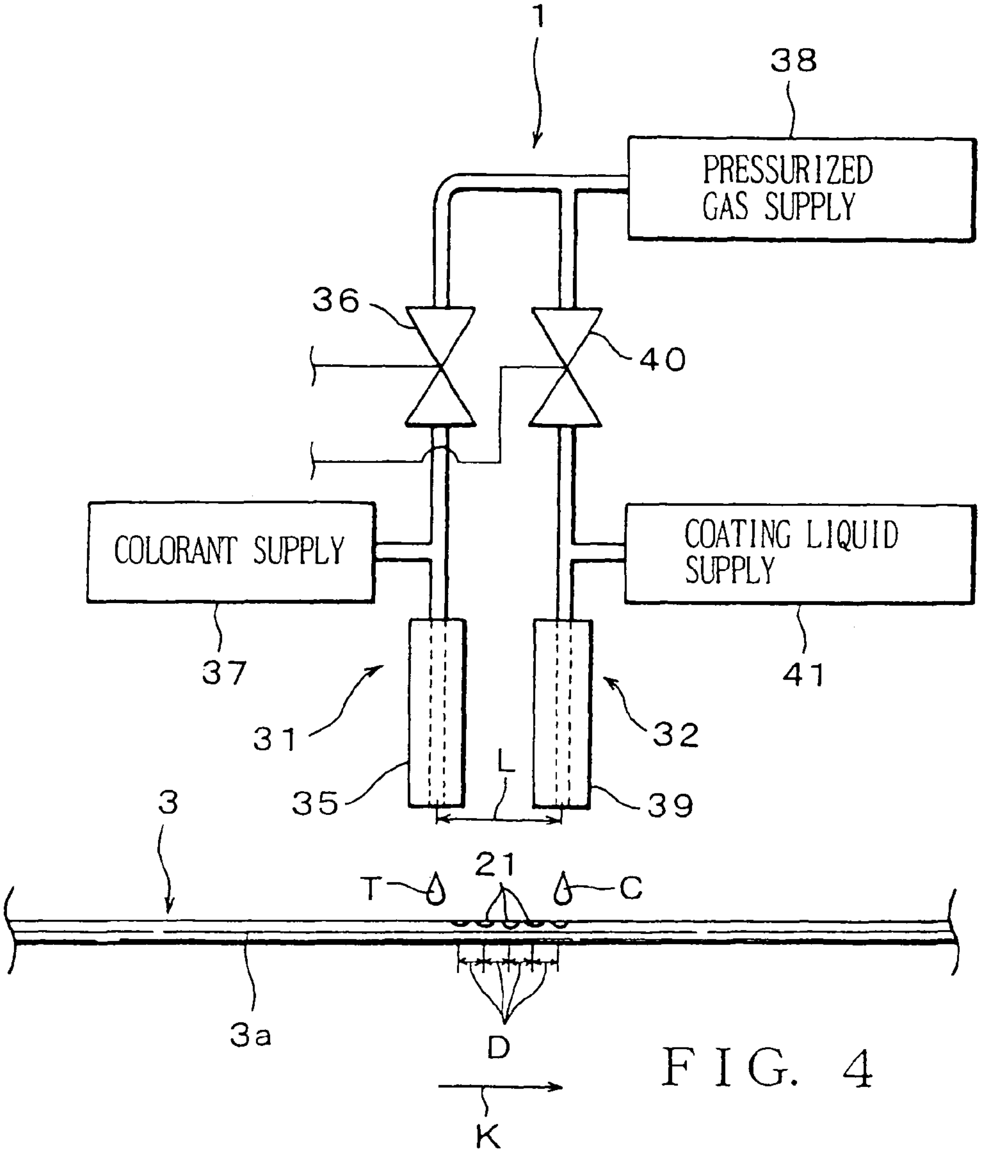
FIG. 4 is an explanatory view showing a state where a jet unit of the coating apparatus of FIG. 2 is operating.

The closing of valve 36 stops jetting of the colorant T though the nozzle 35. As illustrated in FIG. 4, the control unit 34 opens the valve 36 during a predetermined time based on signals of a CPU 47 described later to jet a given amount of the colorant T toward the outer surface 3*a* of the electrical cable 3.

The colorant T is a liquid-like material including a coloring material (industrial organic material) dispersedly dissolved in a solvent such as water. The colorant is a dye or a pigment, which is generally organic and synthetic. A pigment is sometimes used as a die, and vice versa. More specifically, the colorant T may be either of a coloring liquid and a coating material. The coloring liquid includes a dye dispersed in a solution liquid, and the coating material includes a pigment dispersed in a dispersion liquid. Thus, the dye infiltrates into a covering layer when the covering layer is coated with the colorant. In the meantime, the pigment deposits on an outer surface outer surface 3*a* of a covering layer 5 without infiltration into the covering layer 5 when the covering layer 5 is coated with the coating material. However, the process for depositing a colorant on an outer surface of a covering layer shows coloring a partial outer surface of a covering layer with a dye and also painting a partial outer surface 3*a* of a covering layer 5 with a pigment.

The coloring jet unit 31 colors a partial outer surface 3*a* of the electrical cable 3 with the dye or paints a partial outer surface 3*a* of the electrical cable 3 with the pigment. The marking on the partial outer surface 3*a* of the electrical cable 3 to provide a mark 23 is to color the partial outer surface 3*a* of the electrical cable 3 with the dye or to paint the partial outer surface 3*a* of the electrical cable 3 with the pigment.

Preferably, the solvent and the dispersion liquid may be affinitive to a synthetic resin material defining the covering layer. This makes it sure that the dye infiltrates into the covering layer or that the pigment deposits on the outer surface of the covering layer.

As illustrated in FIG. 1, the jet unit 32 is positioned between the pair of feeding belt units 13 of the coating apparatus 1 and the pair of cutting blades 17, 18 of the cutting unit 12. The jet unit 32 is more apart from the coloring jet unit 31 than the pair of feeding belt units 13. That is, the coloring jet unit 31 is positioned upstream from the jet unit 32 in the moving direction of the electrical cable 3.

As illustrated in FIG. 2, the jet unit 32 has the nozzle 39 and the valve 40. The nozzle 39 is opposed to the electrical cable 3 moved along the arrow K by the pair of feeding belt units 13. The nozzle 39 receives a coating liquid C (FIG. 4) from the coating liquid supply 41 (FIG. 2). The coating liquid C is transparent.

The valve 40 communicates with the nozzle 39, and the valve 40 communicates with the pressurized gas supply 38. The opening of the valve 40 jets the coating liquid C toward the outer surface 3*a* of the electrical cable 3 through the nozzle 35 by means of the pressurized gas supplied from the gas supply 38. The closing of the valve 40 stops jetting of the coating liquid C through the nozzle 39. As illustrated in FIG. 4, the control unit 34 opens the valve 40 during a predetermined time based on signals of the CPU 47 to jet a given amount of the coating liquid C toward the outer surface 3*a* of the electrical cable 3.

The coating liquid C consists of a coating material and a solvent for dissolving the coating material and is a sol or gel liquid. The coating material is made of the synthetic resin defining the aforementioned coating layer 6. Preferably, the coating material is at least one selected from poly methylmethacrylate, a silicon resin, polyamide, a urethane resin, ethylene ethyl acrylate copolymer, polyvinyl alcohol, and ethylene-vinyl acetate copolymer. The solvent to dissolve the coating material is preferably selected from alcohol, poly alcohol, ketene, ester, hexane, and chloroform to conform to the coating material.

As illustrated in FIG. 2, the encoder 33 has a rotor 42 which can turn around its central axis. An outer peripheral surface of the rotor 42 contacts an outer surface 3*a* of the electrical cable 3 pinched between the pair of feeding belt units 13. The movement of the electrical cable 3 (core 4) along the arrow K rotates the rotor 42 around the central axis. Of course, the moving distance of the electrical cable 3 along the arrow K is proportional to the rotation number of the rotor 42.

The encoder 33 electrically connects to the control unit 34. The encoder 33 outputs a pulse signal to the control unit 34 every given angle rotation of the encoder 33. That is, the encoder 33 outputs information corresponding to the moving speed of the electrical cable 3 to the control unit 34. Usually, the encoder 33 is mounted on a roll (rotation number counting) rotor 42 that rotates by the friction between the rotor 42 and the electrical cable 3. However, when the pulse number is not proportional to the moving distance of the electrical cable 3 due to the condition of the outer surface 3*a* of the electrical cable 3, the moving speed data may be obtained at another position to feed back the data to compare with the information obtained by the encoder.

Figure 3:
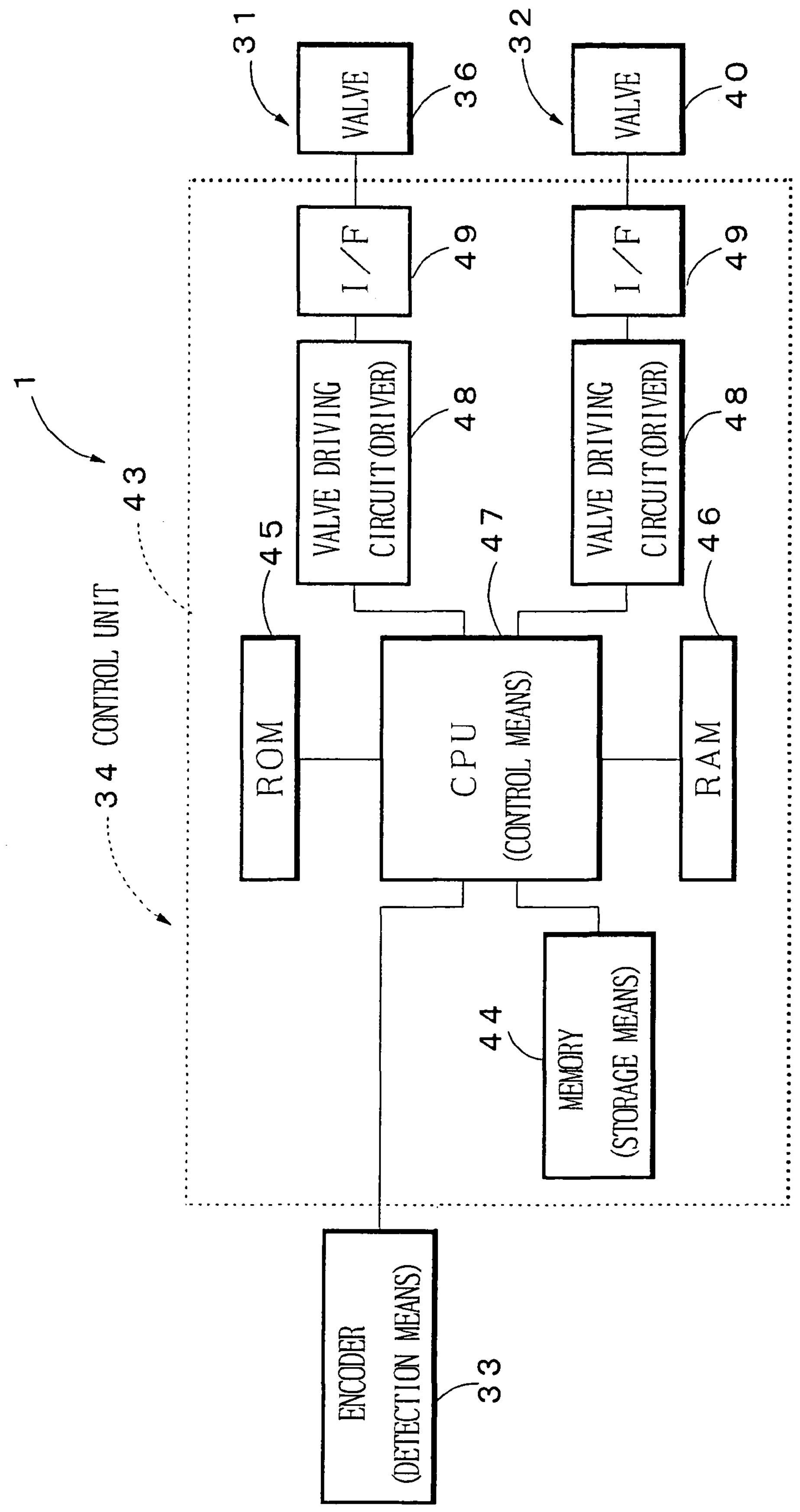
FIG. 3 is an explanatory view showing a control unit of the coating apparatus of FIG. 2.

As illustrated in FIG. 3, the control unit 34 has a box-shaped main housing 43 (FIG. 1), a memory 44 which is a storage means, a known ROM (Read-only Memory) 45, a RAM (Random Access Memory) 46, a CPU (Central Processing Unit) 47, a plurality of valve driving circuits 48, and an interface (shown as I/F in FIG. 3 and called as I/F hereinafter) 49. The control unit 34 is a computer.

The control unit 34 is electrically connected to the encoder 33, the valve 36, valve 40 of the coloring jet unit 31, the jet unit 32, and etc. to control the whole coating apparatus 1. The main housing 43 accommodates the memory 44, ROM 45, RAM 46, CPU 47, etc. The memory 44 stores a pattern of the mark 23 provided on the outer surface 3*a* of the electrical cable 3. More specifically, the memory 44 stores the position of the most downstream one of the dots 21 in the arrow K direction within the mark 23 defined on the outer surface 3*a* of the electrical cable 3, the number of the dots 21, the interval distance D of the centers of the dots 21, an open degree of the valve 36 to define one of the dots 21, and an open state duration of the valve 36.

The memory 44 stores the open degree and open state duration of the valve 40 so that the nozzle 39 of the jet unit 32 can jet an enough amount of the coating liquid C to cover the dots 21. The memory 44 also stores a distance L between the nozzle 35 of the jet unit 31 and the nozzle 39 of the jet unit 32. The distance L is a distance between the coloring jet unit 31 and the jet unit 32. The memory 44 is a non-volatile memory such as EEPROM. ROM 45 stores execution programs of CPU 47, and RAM 46 sores temporarily data required for execution of CPU 47.

CPU 47 is the control means described in this specification. CPU 47 receives information of the moving speed of the electrical cable 3 from the encoder 33. CPU 47 also receives the pattern of the dots 21 from the memory 44. Furthermore, CPU 47 receives the distance L, the open degree of the valve 40, and the open state duration of the valve 40 for covering the dots 21 of the mark 23. CPU 47 opens the valve 36 when the most downstream dot 21 is defined based on the moving speed of the electrical cable 3 that is obtained by the encoder 33.

CPU 47 opens and closes the valve 36 such that the distance between the centers of the dots 21 formed on the outer surface 3*a* of the electrical cable 3 becomes equal to the interval distance D. Furthermore, CPU 47 keeps the valve 36 open with the open state duration and the open degree, which are stored in the memory 44, such that the dot 21 is defined in a predetermined size. Thus, CPU 47 controls the coloring jet unit 31 to jet the colorant T on the outer surface 3*a* of the electrical cable 3 to define the mark 23.

CPU 47 determines whether the electrical cable 3 has moved as much as the distance L after the valve 36 has opened in consideration of the moving speed of the electrical, cable 3 that is obtained by the encoder 33. When the decision is affirmative, the valve 40 of the jet unit 32 opens with an opening degree stored in the memory 44. The opening degree allows the coating liquid C to cover the dots 21. CPU 47 closes the valve 40 after the valve 40 has opened during the predetermined time stored in the memory 44. Thus, CPU 47 controls the jet unit 32 such that the coating liquid C can cover the dots 21, that is, the colorant deposited on the outer surface 3*a* of the electrical cable 3. CPU 47 causes the jet unit 32 to jet the coating liquid C toward the colorant deposited on the outer surface 3*a* of the electrical cable 3.

The valve driving circuits 48 and I/F 49 are provided for each of the coloring jet unit 31 and the jet unit 32. Each valve driving circuit 48 electrically connects to CPU 47. The valve driving circuit 48 also electrically connects to the valve 36 or 40 of the coloring jet unit 31 or the jet unit 32 through I/F 49. When the valve driving circuit 48 receives a signal from CPU 47 to open the valve 36 or 40, the valve driving circuit 48 outputs the signal to the valve 36 or 40 through I/F 49 to open the valve 36 or 40.

That is, the valve driving circuit 48 outputs the aforementioned signals to each corresponding valve 36 or 40 to open and close the valve 36 or 40. The I/F 49 electrically connects the valve driving circuit 48 to the valves 36 and 40. The I/F 49 is attached on an outer wall of the main housing 43.

To provide the mark 23 on the outer surface 3*a* of the electrical cable 3, the encoder 33 inputs a predetermined set of pulse signals into CPU 47. Thereby, CPU 47 opens and closes the valve 36 six times to correspond to the interval distances D with the open degree and the open state duration which are stored in the memory 44, so that the coloring jet unit 31 jets a given amount of the colorant T at regular intervals toward the outer surface 3*a* of the electrical cable 3 as illustrate in FIG. 4. The colorant T deposits on the outer surface 3*a* of the electrical cable 3, and then the solvent or dispersion liquid evaporates. Accordingly, the dye infiltrates into the outer surface 3*a* of the electrical cable 3 or the pigment deposits thereon.

After the coloring jet unit 31 provides the six shots, CPU 47 determines whether the electrical cable 3 has moved as much as the distance L based on signals from the encoder 33. Then, CPU 47 opens and closes the valve 40 so as to give the interval distances D with the open degree and the open state duration which are stored in the memory 44. Thereby, the jet unit 32 jets a given amount of the coating liquid C toward the dot 21 deposited on the outer surface 3*a* of the electrical cable 3. The coating material covers the mark 23 after evaporation of the solvent included in the coating liquid C deposited on the outer surface 3*a* of the electrical cable 3. Thus, the coating layer 6 is defined on a part of the outer surface 3*a* of the electrical cable 3, more specifically on the mark 23.

After the feeding belt units 13 of the cutting installation 2 have fed a predetermined length of the electrical cable 3, the electrical cable 3 stops so that the cutting blades 17, 18 of the cutting unit 12 cut the electrical cable 3, of which the mark 23 has been provided on the outer surface 3*a*. This finally provides the electrical cable 3 having the mark 23 on the outer surface 3*a*, in which the mark 23 is covered by the coating layer 6.

In this embodiment, the jet unit 32 jets a given amount of the coating liquid C on the outer surface 3*a* of the electrical cable 3 at the regular intervals. The coating liquid C can be adjusted in the jetting amount and jetting duration as corresponding to a desirable thickness of the coating layer 6. Therefore, the coating liquid C can be efficiently deposited on the outer surface 3*a* of the electrical cable 3. This can save resources related to the coating liquid C.

The encoder 33 detects the moving speed of the electrical cable 3. CPU 47 instructs the jet unit 32 to jet the colorant deposited on the outer surface 3*a* in consideration of the moving speed of the electrical cable 3. This surely defines the coating layer 6 on the colorant deposited on the outer surface 3*a* of the electrical cable 3, preventing the colorant from wearing off with time.

The coating apparatus 1 is mounted on the electrical cable cutting installation 2. Thus, the coating layer 6 is provided on the outer surface 3*a* of the electrical cable 3 when a long electrical cable 3 is cut into given length ones. This decreases a space required for installing the coating apparatus 1 and the electrical cable cutting installation 2 and also decreases working hours for assembling the electrical cable 3.

In the first embodiment, there is provided only one coloring jet unit 31. However the coloring jet unit 31 may have a plurality of coloring jets that can define the mark 23 with a plurality of colorants, that is, with a plurality of colors.

Figure 8:
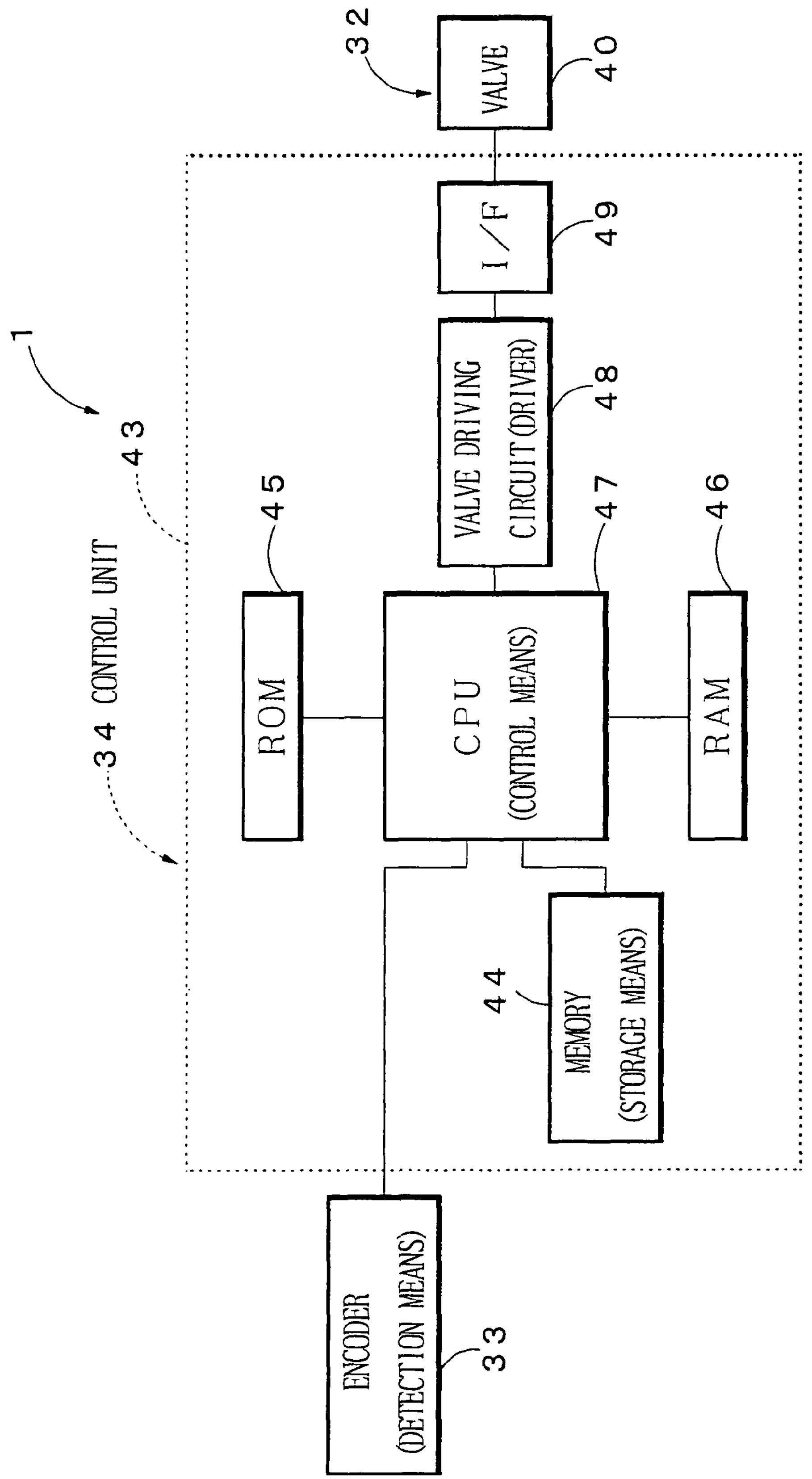
FIG. 8 is an explanatory view mainly showing a configuration of a control unit of an electrical cable cutting installation of a second embodiment of the present invention.

Next, referring to FIG. 8, a coating apparatus 1 of a second embodiment according to the present invention will be discussed, in which the same referent numeral designates the same component as in the first embodiment and will not be discussed again. The second embodiment does not include the coloring jet unit 31. The memory 44 of the second embodiment stores a desirable pattern of the coating layer 6 provided on the outer surface 3*a* of the electrical cable 3. The memory 44 stores a coating pattern of the coating layer 6 defined on the outer surface 3*a* of the electrical cable 3.

More specifically, the memory 44 stores a starting point for providing the coating layer 6 on the outer surface 3*a* of the electrical cable 3, a distance for defining a time interval to open the valve 40 again, and an end point of the coating layer 6 on the outer surface 3*a* of the electrical cable 3.

In the second embodiment, CPU 47 opens the valve 40 to start defining of a pattern of the coating layer 6 stored in the memory 44 based on the moving speed of the electrical cable 3 which is obtained by the encoder 33. CPU 47 closes the valve 40 after the valve 40 has opened during the predetermined time stored in the memory 44.

CPU 47 determines whether the electrical cable 3 has moved as much as the distance L after the valve 40 has opened based on the moving speed of the electrical cable 3 that is obtained by the encoder 33. When the decision is affirmative, the valve 40 opens. CPU 47 closes the valve 40 after the valve 40 has opened during the predetermined time stored in the memory 44 to provide the coating layer 6.

The CPU 47 opens and closes the valve 40 based on the pattern store in the memory 44. In the second embodiment, CPU 47 controls the valve 40 of the jet unit 32 to provide the coating layer 6 on the outer surface 3*a* of the electrical cable 3 according to the pattern stored in the memory 44.

In the second embodiment, the jet unit 32 jets a given amount of the coating liquid C on the outer surface 3*a* of the electrical cable 3 at the regular intervals. The coating liquid C can be adjusted in the jetting amount and jetting duration as corresponding to a desirable thickness of the coating layer 6. Therefore, the coating liquid C can be efficiently deposited on the outer surface 3*a* of the electrical cable 3. This can save resources related to the coating liquid C.

The encoder 33 detects the moving speed of the electrical cable 3. CPU 47 instructs the jet unit 32 to jet the coating liquid C on the outer surface 3*a* in consideration of the moving speed of the electrical cable 3. This surely defines the coating layer 6 on the outer surface 3*a* of the electrical cable 3 in the predetermined pattern stored in the memory 44 regardless of the moving speed of the electrical cable 3.

Thus, the coating liquid C effectively deposits on the outer surface 3*a* of the electrical cable 3, which saves the coating liquid C to define the coating layer 6.

In the first and second embodiments, the control unit 34 includes a computer having ROM 45, RAM 46, and CPU 47. However, the present invention may have a known digital circuit in place of the control unit 34. Preferably, the digital circuit may have a circuit for counting pulse signals output from the encoder 33 and another circuit for determining whether the valves 36, 40 shall be opened or closed based on the number of the pulse signals.

The discussed embodiments relate to the electrical cable 3 used to assemble a wiring harness arranged in an automobile vehicle. However of course, the electrical cable 3 may be used for electronic instruments like a portable computer and various types of electric machines.

In the present invention, the coloring liquid and the paint material may be any one of acryl paints, inks used as dyes or pigments, UV (ultra violet) inks, etc.

What is claimed is:

1. An electrical cable coating method for providing a coating layer on a covering layer on an outer surface of an electrical cable which is moving along a predetermined direction, the method comprising:

jetting a drop of colorant a plurality of times, at regular intervals, on a covering layer on the outer surface of the electrical cable to deposit the colorant on the covering layer on the outer surface of the electrical cable while measuring a moving speed of the electrical cable, wherein the colorant has a color that is distinguishable from a color of the covering layer, wherein the colorant on the covering layer has a plurality of spaced apart circular shapes, downstream from the colorant jetting in the cable moving direction, opening a valve for jetting a drop of coating liquid a plurality of times, at regular intervals, wherein the coating liquid is transparent, storing a distance between jetting the coating liquid and jetting the colorant, storing an open state duration of the valve, receiving the stored distance, and determining whether the electrical cable has moved as much as the received stored distance based on the measured electrical cable moving speed, and controlling jetting of the coating liquid to jet the coating liquid on the colorant coated on the outer surface of the electrical cable to deposit the coating liquid on the outer surface based on the stored open state duration of the valve and based on a result of the determining, wherein the coating liquid includes a coating material and a solvent for dissolving the coating material, wherein the coating liquid prevents the colorant from wearing off from the covering layer.

2. The electrical cable coating method of claim 1, wherein the jetting of the colorant corresponds to jetting a predetermined amount of the colorant.

3. The electrical cable coating method of claim 1, wherein the jetting of the coating liquid corresponds to jetting a predetermined amount of the coating liquid.

4. The electrical cable coating method of claim 1, wherein the colorant forms a plurality of circular dots on the covering layer.

* * * * *